(12) United States Patent
Komatani

(10) Patent No.: US 9,287,365 B2
(45) Date of Patent: Mar. 15, 2016

(54) METHOD OF MANUFACTURING SEMICONDUCTOR DEVICE

(71) Applicant: SUMITOMO ELECTRIC DEVICE INNOVATIONS, INC., Yokohama-shi, Kanagawa (JP)

(72) Inventor: Tsutomu Komatani, Yokohama (JP)

(73) Assignee: SUMITOMO ELECTRIC DEVICE INNOVATIONS, INC., Yokohama-shi, Kanagawa (JP)

(*) Notice: Subject to any disclaimer, the term of this patent is extended or adjusted under 35 U.S.C. 154(b) by 0 days.

(21) Appl. No.: 14/286,281

(22) Filed: May 23, 2014

(65) Prior Publication Data
US 2015/0034960 A1 Feb. 5, 2015

(30) Foreign Application Priority Data
Jul. 31, 2013 (JP) .................................. 2013-159688

(51) Int. Cl.
| | |
|---|---|
| H01L 29/778 | (2006.01) |
| H01L 29/20 | (2006.01) |
| H01L 29/66 | (2006.01) |
| H01L 29/205 | (2006.01) |
| H01L 21/02 | (2006.01) |
| H01L 21/027 | (2006.01) |
| H01L 21/311 | (2006.01) |
| H01L 21/3115 | (2006.01) |

(52) U.S. Cl.
CPC ........ *H01L 29/2003* (2013.01); *H01L 21/0234* (2013.01); *H01L 21/0272* (2013.01); *H01L 21/0277* (2013.01); *H01L 21/02326* (2013.01); *H01L 21/02329* (2013.01); *H01L 21/02337* (2013.01); *H01L 21/3115* (2013.01); *H01L 21/31144* (2013.01); *H01L 29/205* (2013.01); *H01L 29/66462* (2013.01); *H01L 29/7787* (2013.01)

(58) Field of Classification Search
CPC ............... H01L 29/66431; H01L 29/66462; H01L 29/778; H01L 29/7786
See application file for complete search history.

(56) References Cited

U.S. PATENT DOCUMENTS

| | | | | |
|---|---|---|---|---|
| 2004/0159865 A1* | 8/2004 | Allen et al. | ............... | 257/280 |
| 2006/0244010 A1* | 11/2006 | Saxler | ............... | 257/194 |
| 2007/0164322 A1* | 7/2007 | Smith et al. | ............... | 257/256 |
| 2008/0290371 A1* | 11/2008 | Sheppard | ............... | H01L 21/046 257/192 |
| 2010/0317164 A1* | 12/2010 | Komatani | ............... | H01L 21/28264 438/172 |
| 2011/0031532 A1* | 2/2011 | Kikkawa | ............... | H01L 29/7787 257/194 |
| 2012/0119260 A1* | 5/2012 | Radulescu | ............... | H01L 21/76804 257/194 |

FOREIGN PATENT DOCUMENTS

JP 2000-039717 2/2000

* cited by examiner

*Primary Examiner* — Bryan Junge
(74) *Attorney, Agent, or Firm* — Smith, Gambrell & Russell, LLP.

(57) ABSTRACT

A semiconductor device includes a semiconductor layer, an insulating film of silicon nitride on the semiconductor layer, source and drain electrodes formed in openings of the insulating film and in contact with the semiconductor layer, and a gate electrode formed in an opening in the insulating film that is located between the source electrode and the drain electrode and formed in contact with the semiconductor layer. The insulating film has an Si content that is uniform in a direction of thickness of the insulating film, an upper region, and a lower region. The upper region can have an oxygen concentration that is greater than that of the lower region. The upper region can be formed by exposing the surface of the insulating film to ozone or an oxygen plasma.

11 Claims, 8 Drawing Sheets

(a)

(b)

(c)

(a)

(b)

(c)

(a)

(b)

(a)

(b)

METHOD OF MANUFACTURING SEMICONDUCTOR DEVICE

BACKGROUND OF THE INVENTION

1. Field of the Invention

The present invention relates to a method of manufacturing a semiconductor device and, for example, to a semiconductor device manufacturing method making use of electron beam exposure.

2. Related Background Art

There are known semiconductor device manufacturing methods making use of the electron beam exposure. An electron beam used in the electron beam exposure has the wavelength shorter than those of ultraviolet beams used in general projection exposure and thus has the feature of allowing realization of high resolution. There is a developed method that enables a lithography step using the electron beam exposure to be performed with high sensitivity (e.g., cf. Patent Literature 1).

Patent Literature 1: Japanese Patent Application Laid-Open Publication No. 2000-39717

SUMMARY OF THE INVENTION

With a process of forming a resist film for electron beam exposure on an insulating film provided on a nitride semiconductor layer or on a silicon carbide layer and subjecting this resist film to the electron beam exposure, an opening pattern may not be formed in a desired shape in the resist film and, for example, it may result in degradation of dimension controllability.

The present invention has been accomplished, in view of the above problem, and it is purpose of the present invention to provide a semiconductor device manufacturing method which allows the opening pattern to be formed in a good shape in the resist film.

An aspect of the present invention is a method of manufacturing a semiconductor device comprising: a step of forming an insulating film of any one of silicon nitride, silicon oxide, and silicon oxynitride, on a semiconductor layer; a step of introducing oxygen or nitrogen to the insulating film; a step of forming a resist film on the insulating film, after the step of introducing the oxygen or nitrogen; and a step of exposing the resist film with an electron beam. According to the aspect of the present invention, an opening pattern can be formed in a good shape in the resist film.

In the foregoing configuration mentioned above, there may be a configuration wherein the step of introducing oxygen or nitrogen is carried out by exposing the surface of the insulating film to an ozone, an oxygen plasma, or a nitrogen plasma.

In the foregoing configuration mentioned above, there may be a configuration further comprising a step of performing process of etching the insulating film through an opening in the resist pattern formed by the step of exposing.

In the foregoing configuration mentioned above, there may be a configuration further comprising a step of forming a gate electrode or an ohmic electrode in an opening pattern formed in the insulating film by the etching process.

In the foregoing configuration mentioned above, there may be a configuration wherein the insulating film contains silicon nitride at a composition ratio of silicon to nitrogen of not less than 0.76.

In the foregoing configuration mentioned above, there may be a configuration wherein the nitride semiconductor layer includes channel layer and an electron supply layer with a larger bandgap than the channel layer.

In the foregoing configuration mentioned above, there may be a configuration wherein the step of introducing oxygen is carried out under conditions of ozone concentration in the range of 10% to 100%, a pressure in the range of 0.1 Torr to 10 Torr, a temperature in the range of 150° C. to 350° C., and a treatment time in the range of 1 minute to 5 minutes.

In the foregoing configuration mentioned above, there may be a configuration wherein the step of introducing oxygen is carried out by exposing the surface of the insulating film to the oxygen plasma under conditions of an oxygen concentration in the range of 3% to 100%, a pressure in the range of 0.03 Torr to 5 Torr, an RF power in the range of 50 W to 800 W, a temperature in the range of 25° C. to 350° C., and a treatment time in the range of 1 minute to 10 minutes.

In the foregoing configuration mentioned above, there may be a configuration wherein the step of introducing nitrogen is carried out by exposing the surface of the insulating film to the nitrogen plasma under conditions of a nitrogen concentration of 100%, a pressure in the range of 0.03 Torr to 5 Torr, an RF power in the range of 50 W to 800 W, a temperature in the range of 25° C. to 350° C., and a treatment time in the range of 1 minute to 10 minutes.

In the foregoing configuration mentioned above, there may be a configuration wherein a condition of exposing the electron beam to the resist layer is an acceleration voltage in the range of 25 kV to 50 kV, a current value in the range of 0.01 nA to 0.5 nA, and a dose amount in the range of 2 $\mu C/cm^2$ to 50 $\mu C/cm^2$.

In the foregoing configuration mentioned above, there may be a configuration wherein the semiconductor layer is composed of nitride semiconductor or silicon carbide.

In the foregoing configuration mentioned above, there may be a configuration wherein a composition of oxygen or nitrogen in an upper area of the insulating film is greater than that of a lower area of the insulating film after performing the step of introducing of oxygen or nitrogen.

An aspect of the present invention is a semiconductor device comprising: a semiconductor layer; an insulating film of any one of silicon nitride, silicon oxide, and silicon oxynitride on the semiconductor layer, wherein the concentration of oxygen or nitrogen of an upper region of the insulating film is greater than that of a lower region of the insulating film; source and drain electrodes formed in openings of the insulating film and in contact with the semiconductor layer, and a gate electrode formed in an opening located between the source electrode and the drain electrode of the insulating film and in contact with the semiconductor layer.

In the foregoing configuration mentioned above, there may be a configuration wherein the insulating film Si content is uniform in a direction of thickness of the insulating film.

In the foregoing configuration mentioned above, there may be a configuration wherein the thickness of the upper region of the insulating film is equal to or larger than 2 nm.

In the foregoing configuration mentioned above, there may be a configuration wherein the concentration of oxygen in the upper region is greater than that of the lower region and thickness of the upper region is equal to or greater than 2 nm.

In the foregoing configuration mentioned above, there may be a configuration wherein the width of the opening of the insulating film for the gate electrode is 0.2 μm or less.

In the foregoing configuration mentioned above, there may be a configuration wherein the thickness of the insulating film is equal to or smaller than 20 nm.

In the foregoing configuration mentioned above, there may be a configuration wherein the semiconductor layer is composed of gallium nitride, aluminum gallium nitride, indium aluminum nitride, indium aluminum gallium nitride or aluminum nitride.

An aspect of the present invention is a semiconductor device comprising: a semiconductor layer, an insulating film of any one of silicon nitride, silicon oxide, and silicon oxynitride on the semiconductor layer, and having an upper region and a lower region, the upper region formed by exposing the surface of the insulating film to an ozone, an oxygen plasma, or a nitrogen plasma; source and drain electrodes formed in openings of the insulating film and in contact with the semiconductor layer; and a gate electrode formed in an opening located between the source electrode and the drain electrode of the insulating film and in contact with the semiconductor layer.

The present invention leads to obtain an opening pattern to be formed in a good shape in the resist film.

DESCRIPTION OF THE PREFERRED EMBODIMENTS

Embodiments of the present invention will be described below.

Figure 1:
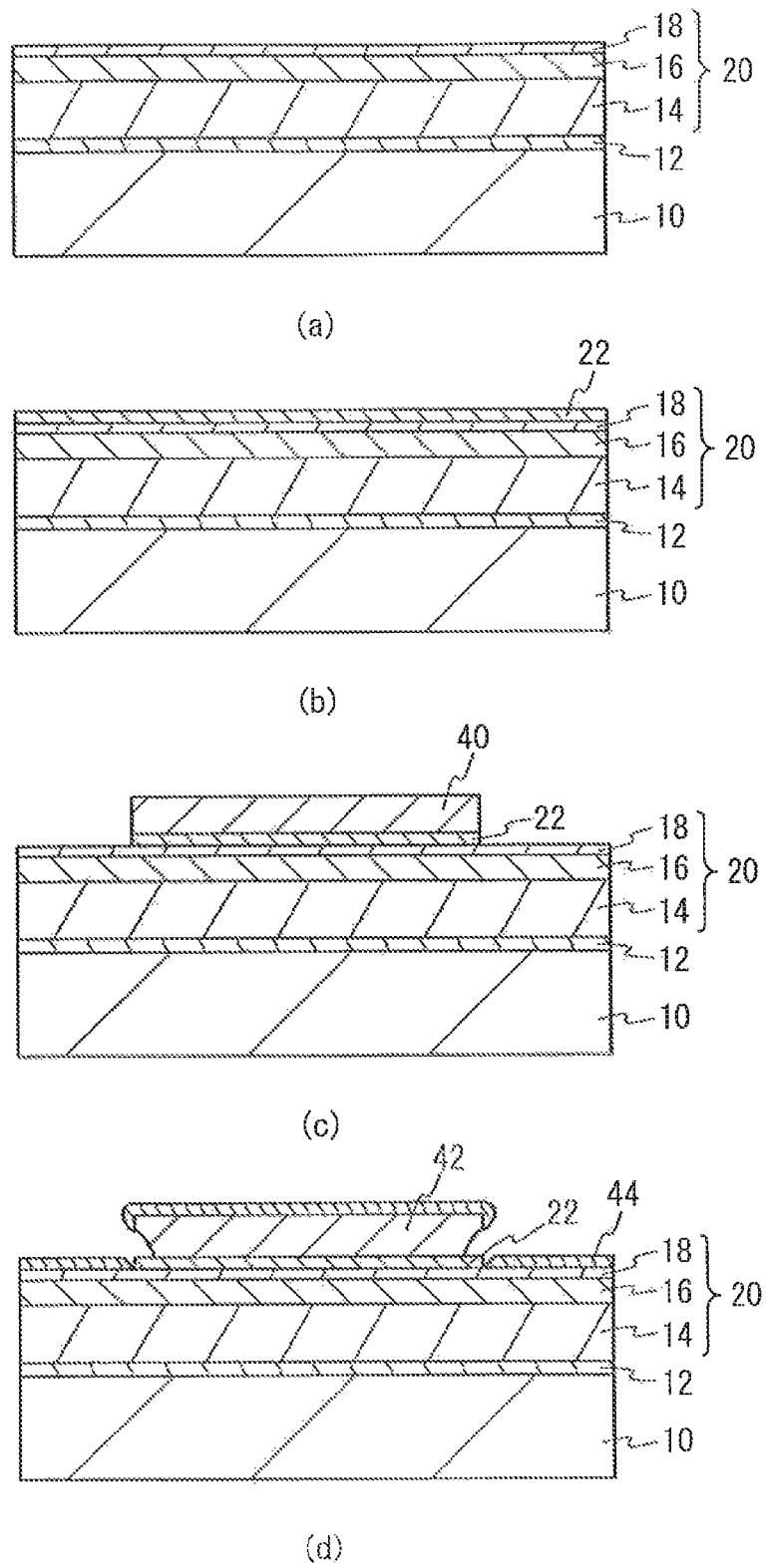
FIG. 1(a) to FIG. 1(d) are cross-sectional views (Part 1) showing the semiconductor device manufacturing method according to Embodiment 1.
Figure 2:
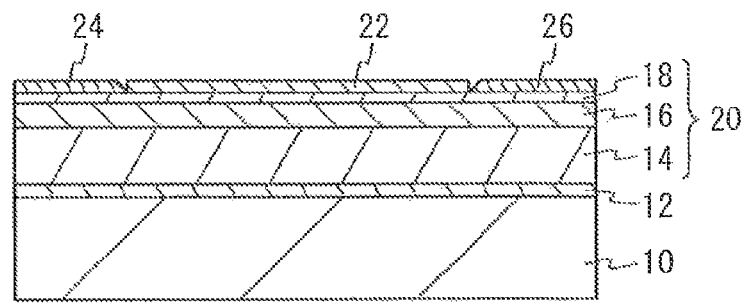
FIG. 2(a) to FIG. 2(c) are cross-sectional views (Part 2) showing the semiconductor device manufacturing method according to Embodiment 1.
Figure 2:
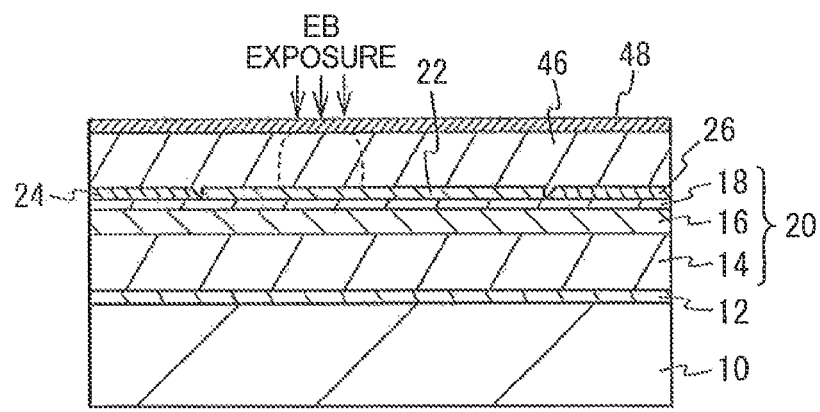
Figure 2:
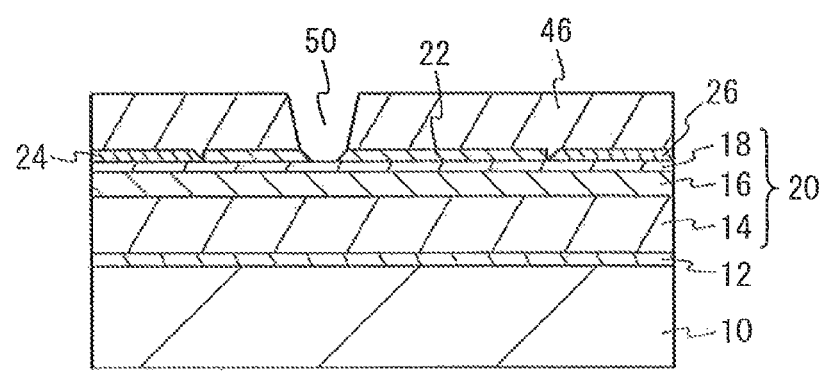
Figure 3:
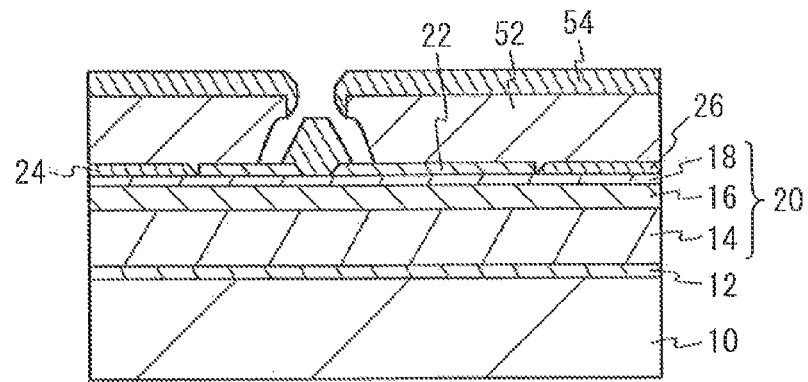
FIG. 3(a) to FIG. 3(c) are cross-sectional views (Part 3) showing the semiconductor device manufacturing method according to Embodiment 1.
Figure 3:
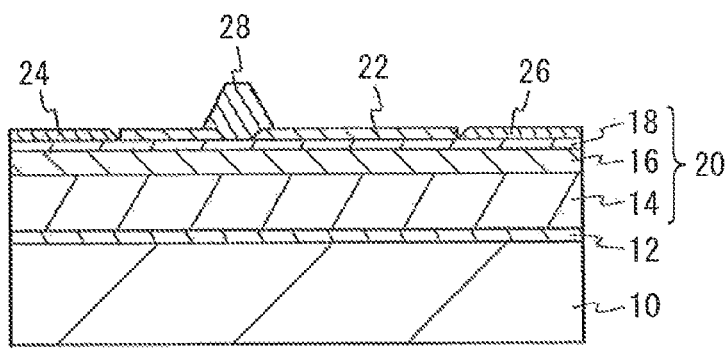
Figure 3:
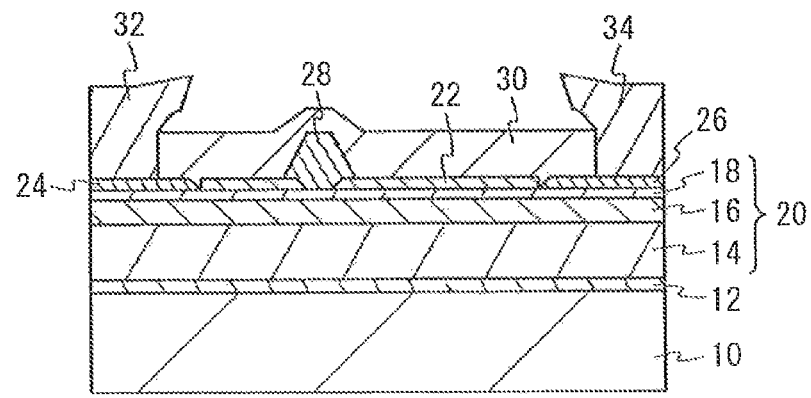

In Embodiment 1, the semiconductor device manufacturing method will be described with an example of a High Electron Mobility Transistor (HEMT) using nitride semiconductors, as a semiconductor device. FIG. 1(a) to FIG. 3(c) are cross-sectional views showing the manufacturing method of the semiconductor device according to Embodiment 1. As shown in FIG. 1(a), a buffer layer 12 of aluminum nitride (AlN) is formed on a substrate 10 of silicon carbide (SiC). The substrate 10 may also be a silicon (Si) substrate or a sapphire substrate, besides the SiC substrate. The buffer layer 12 is formed in contact with a top face of the substrate 10. Grown as nitride semiconductor layer 20 in the order located on the buffer layer 12 are an electron transit layer 14 of undoped gallium nitride (GaN), an electron supply layer 16 of aluminum gallium nitride (AlGaN), and a cap layer 18 of n-type GaN. Besides AlGaN, the electron supply layer 16 may also be one comprising indium aluminum nitride (InAlN). The electron transit layer 14 is formed in contact with a top face of the buffer layer 12. The electron supply layer 16 is formed in contact with a top face of the electron transit layer 14. The cap layer 18 is formed in contact with a top face of the electron supply layer 16. The growth of each of these layers can be implemented, for example, by using the Metal Organic Chemical Vapor Deposition (MOCVD) process. Embodiment 1 is the example with the buffer layer 12, but may be configured without the buffer layer 12.

The thickness of the buffer layer 12 is, for example, 300 nm, the thickness of the electron transit layer 14, for example, 1.0 μm, the thickness of the electron supply layer 16, for example, 20 nm, and the thickness of the cap layer 18, for example, 5 nm. In the HEMT, a Two-Dimensional Electron Gas (2DEG) is produced at an interface between the electron transit layer 14 and the electron supply layer 16.

As shown in FIG. 1(b), an insulating film 22 of silicon nitride (SiN) is deposited on the cap layer 18. The insulating film 22 is formed in contact with a top face of the cap layer 18. The deposition of the insulating film 22 can be carried out, for example, by using the Plasma-Enhanced Chemical Vapor Deposition (PECVD) process. The thickness of the insulating film 22 is, for example, 20 nm. The refractive index of the insulating film 22 is, for example, 2.35 and is a silicon (Si)-rich film for the purpose of suppressing the current collapse. In terms of suppressing the current collapse, a composition ratio (Si/N) of silicon (Si) to nitrogen (N) in the insulating film 22 is, for example, preferably in the range of not less than 0.76, more preferably in the range of not less than 0.85, and still more preferably in the range of not less than 1.0. After the deposit of the insulating film 22, the surface of the insulating film 22 is exposed to an ozone atmosphere, performing a treatment to oxidize the surface of the insulating film 22. The oxidation treatment by exposing the surface of the insulating film 22 to the ozone atmosphere can be carried out under the below conditions.

Ozone concentration: 10% to 100% (the rest is oxygen)
Pressure: 0.1 Torr to 10 Torr
Temperature: 150° C. to 350° C.
Treatment Time: 1 minute to 5 minutes The ozone concentration is preferably in the range of 30% to 100% and more preferably in the range of 50% to 100%. The pressure is preferably in the range of 1 Torr to 8 Torr and more preferably in the range of 3 Torr to 5 Torr. The temperature is preferably in the range of 200° C. to 300° C. and more preferably in the range of 220° C. to 280° C. The treatment time is preferably in the range of 2 minutes to 4 minutes and more preferably in the range of 2.5 minutes to 3.5 minutes. Prior to execution of the oxidation treatment, the surface of the insulating film 22 may be subjected to a pretreatment to immerse the surface in isopropyl alcohol (IPA) so as to clean it. The immersion time in IPA can be, for example, 5 minutes.

Figure 4:
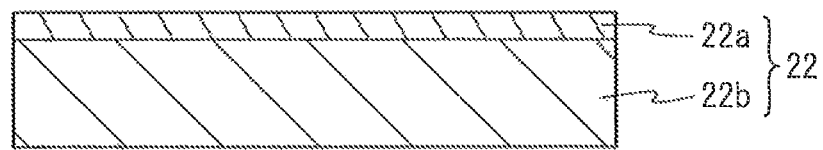
FIG. 4 is a cross-sectional view showing an insulating film after an oxidation treatment.

In the insulating film 22 of SiN there are, for example, Si—H (hydrogen) bonds, dangling bonds of Si atoms, etc. as well as Si—N bonds. The oxidation treatment for the surface of the insulating film 22 can bring about replacement of H of Si—H bonds with O (oxygen) and binding of O to the dangling bonds of Si atoms, which can reduce defects in the insulating film 22. FIG. 4 is a cross-sectional view showing the insulating film 22 after the oxidation treatment. As shown in FIG. 4, the oxidation treatment for the surface of the insulating film 22 can change the surface part of the insulating film 22 into a defect-reduced region 22a and keep the other part as a Si-rich region 22b.

As shown in FIG. 1(c), a resist film 40 is formed on the insulating film 22. The resist film 40 is used in exposure with ultraviolet light and, for example, a resist film of a novolac resin. The resist film 40 is subjected to exposure to ultraviolet exposure and development to remove the resist film 40 from regions where a source electrode and a drain electrode are to be formed. Thereafter, the insulating film 22 is subjected to an etching process with the resist film 40 as a mask, to remove the insulating film 22 from the regions where the source electrode and the drain electrode are to be formed. The etching process may be carried out by dry etching or by wet etching.

As shown in FIG. 1(d), a resist film 42 for lift-off is formed while having opening patterns in the regions where the source electrode and the drain electrode are to be formed. The resist film 42 is used in exposure with ultraviolet light as the aforementioned resist film 40 is. After formation of the resist film 42, titanium (Ti) and aluminum (Al) are formed in order from the cap layer 18 side by the evaporation process to form metal films 44. The source electrode 24 and drain electrode 26 may be formed on the electron supply layer 16 as well as on the cap layer 18.

As shown in FIG. 2(a), the resist film 42 is removed by lift-off. Thereafter, the metal films 44 are annealed, for example, at a temperature of not less than 500° C. and not more than 800° C. to form the source electrode 24 and the drain electrode 26 which are ohmic electrodes in ohmic contact with the cap layer 18.

As shown in FIG. 2(b), an EB resist film 46 for Electron Beam (EB) exposure is formed on the insulating film 22, the source electrode 24, and the drain electrode 26. The EB resist film 46 is, for example, made of an acrylic resin in the thickness of 400 nm. The EB resist film 46 is formed on the surface of the insulating film 22 in FIG. 2(b), but the EB resist film 46 may be formed through another insulating film (e.g., which can be an insulating film made of any one of silicon nitride, aluminum nitride, aluminum oxide, and silicon oxide) on the surface of the insulating film 22. When the other insulating film is provided as described above, it can offer improvement, for example, in drift, collapse, electricity deterioration, or variation of parasitic capacitance. Next, an antistatic film 48 is formed on the EB resist film 46. A thin-film metal layer, for example, comprising aluminum (Al) or titanium (Ti) may be used instead of the antistatic film 48. It is also possible to adopt configurations using neither of the antistatic film 48 and the thin-film metal layer. In order to form an opening pattern in the EB resist film 46 in a region where a gate electrode is to be formed, the EB resist film 46 is subjected to electron beam exposure (e.g., under the conditions of acceleration voltage: 40 kV, current value: 0.2 nA, and dose amount: 20 $\mu C/cm^2$), removal of the antistatic film, and development. The ranges of the conditions for the electron beam exposure are as follows. The acceleration voltage can be determined in the range of 25 kV to 50 kV, preferably in the range of 30 kV to 45 kV, and more preferably in the range of 35 kV to 40 kV. The current value can be determined in the range of 0.01 nA to 0.5 nA, preferably in the range of 0.1 nA to 0.4 nA, and more preferably in the range of 0.2 nA to 0.3 nA. The dose amount can be determined in the range of 2 $\mu C/cm^2$ to 50 $\mu C/cm^2$, preferably in the range of 10 $\mu C/cm^2$ to 40 $\mu C/cm^2$, and more preferably in the range of 20 $\mu C/cm^2$ to 30 $\mu C/cm^2$. An irradiation period can be varied depending upon the film thickness of the EB resist film 46, the foregoing conditions, and so on. Use of the electron beam exposure allows the gate electrode to be formed in a shorter gate length, thereby reducing the gate capacitance, when compared to the exposure with ultraviolet light.

As shown in FIG. 2(c), an opening pattern 50 is formed in the EB resist film 46 by the electron beam exposure and development and, thereafter, the insulating film 22 is subjected to an etching process with the EB resist film 46 as a mask, to etch the insulating film 22 from the region where the gate electrode is to be formed. The etching process may be carried out by either of dry etching and wet etching.

As shown in FIG. 3(a), a resist film 52 for lift-off having an opening pattern in the region where the gate electrode is to be formed is formed. The resist film 52 is a resist film used in exposure with ultraviolet light as the aforementioned resist films 40, 42 are. After formation of the resist film 52, nickel (Ni) and gold (Au) are deposited in order from the cap layer 18 side by the evaporation process to form a metal film 54.

As shown in FIG. 3(b), the resist film 52 is removed by lift-off to form the gate electrode 28 in Schottky contact with the cap layer 18.

As shown in FIG. 3(c), an interlayer insulating film 30 of SiN is formed so as to cover the gate electrode 28, source electrode 24, and drain electrode 26. The interlayer insulating film 30 can be deposited, for example, by using the plasma-enhanced CVD process. The thickness of the interlayer insulating film 30 is, for example, 500 nm. The interlayer insulating film 30 is removed from on the source electrode 24 and on the drain electrode 26 and a source wiring line 32 in electrical connection to the source electrode 24 and a drain wiring line 34 in electrical connection to the drain electrode 26 are formed in the regions from which the interlayer insulating film 30 has been removed. The source wiring line 32 and the drain wiring line 34 are metal films in which Ti, Al, and Au plated layers are formed in order from the electrode side. The semiconductor device of Embodiment 1 is formed by the method including the steps as described above.

In Embodiment 1, as described with FIG. 1(b), the oxidation treatment for the surface of the insulating film 22 is carried out by exposing the surface of the insulating film 22 to the ozone atmosphere, but it may be carried out by exposing the surface of the insulating film 22 to an oxygen plasma. The oxidation treatment by exposing the surface of the insulating film 22 to the oxygen plasma can be carried out under the below conditions.

Oxygen concentration: 3% to 100% (the rest is nitrogen)
Pressure: 0.03 Torr to 5 Torr
RF power: 50 W to 800 W
Temperature: 25° C. to 350° C.
Treatment time: 1 minute to 10 minutes The oxygen concentration is preferably in the range of 30% to 100% and more preferably in the range of 50%/o to 100%. The pressure is preferably in the range of 0.5 Torr to 3 Torr and more preferably in the range of 1 Torr to 2 Torr. The RF power is preferably in the range of 200 W to 600 W and more preferably in the range of 300 W to 500 W. The temperature is preferably in the range of 25° C. to 200° C. and more preferably in the range of 25° C. to 100° C. The treatment time is preferably in the range of 2 minutes to 8 minutes and more preferably in the range of 3 minutes to 5 minutes.

Experiments about the oxidation treatment conducted by the Inventor will be described below. The Inventor conducts the oxidation treatment by forming a SiN film in the thickness of 10 nm on a plurality of substrates by the plasma-enhanced CVD process and exposing the surface of the SiN film to the ozone atmosphere or to the oxygen plasma. The oxidation treatment by exposing the surface to the ozone atmosphere is carried out under the below conditions.

Ozone concentration: 50% (the rest is oxygen)
Pressure: 3 Torr
Temperature: 250° C.
Treatment time: 3 minutes The oxidation treatment by exposing the surface to the oxygen plasma is carried out under the below conditions.

Figure 5:
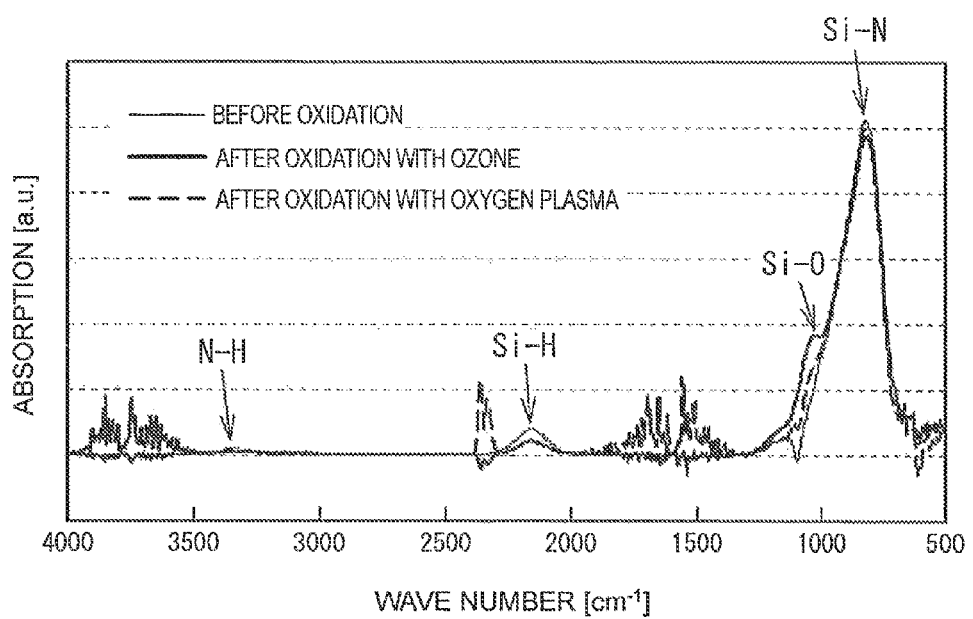
FIG. 5 shows the measurement results of FTIR.

Oxygen concentration: 100%
Pressure: 1 Torr
RF power: 400 W
Temperature: 25° C.
Treatment time: 3 minutes The SiN films before and after the oxidation treatment are compared by measurement making use of the FTIR (Fourier Transform InfraRed spectrometry) method. The FTIR method is a measurement method of irradiating a material with infrared light and investigating a composition of the material or the like from absorption amounts of infrared light having energies corresponding to vibration energies of molecules. FIG. 5 is showing the measurement results of FTIR. In FIG. 5 the horizontal axis represents wave numbers and the vertical axis absorption amounts in arbitrary unit. In FIG. 5 a thin solid line indicates the measurement result of the SiN film before execution of the oxidation treatment, a thick solid line indicates the measurement result after the oxidation treatment by the exposure to the ozone atmosphere, and a thick broken line indicates the measurement result after the oxidation treatment by the exposure to the oxygen plasma. As shown in FIG. 5, it can be confirmed that Si—H bonds decrease and Si—O bonds increase after execution of the oxidation treatment by either method of the ozone atmosphere and the oxygen plasma. Namely, it can be confirmed that when the surface of the SiN film is subjected to the oxidation treatment, H in Si—H bonds is replaced with O and O is bound to dangling bonds of Si atoms. When it is assumed that the surface of the SiN film is uniformly oxidized by the oxidation treatment, the thickness of oxidized part can be estimated to be approximately 2 nm, from the measurement results of FTIR. Furthermore, the disturbance in the FTIR measurement spectra (particularly, in the thick broken line) is due to water attached to the SiN film and therefore no particular consideration is given thereto.

The below will describe the reason for performing the oxidation treatment for the surface of the insulating film 22. The Inventor measures with a Scanning Electron Microscope (SEM) for length measurement, an opening pattern formed by dry etching in the insulating film 22 described with FIG. 2(c), in the case where the oxidation treatment is carried out by exposing the surface of the insulating film 22 to the ozone atmosphere under the below conditions.

Ozone concentration: 50% (the rest is oxygen)
Pressure: 3 Torr
Temperature: 250° C.
Treatment time: 3 minutes For comparison, the Inventor also measures with the length-measurement SEM, an opening pattern formed by dry etching in the insulating film 22 in Comparative Example 1 manufactured by the same method as in Embodiment 1 except that the surface of the insulating film 22 is not subjected to the oxidation treatment.

Figure 6:
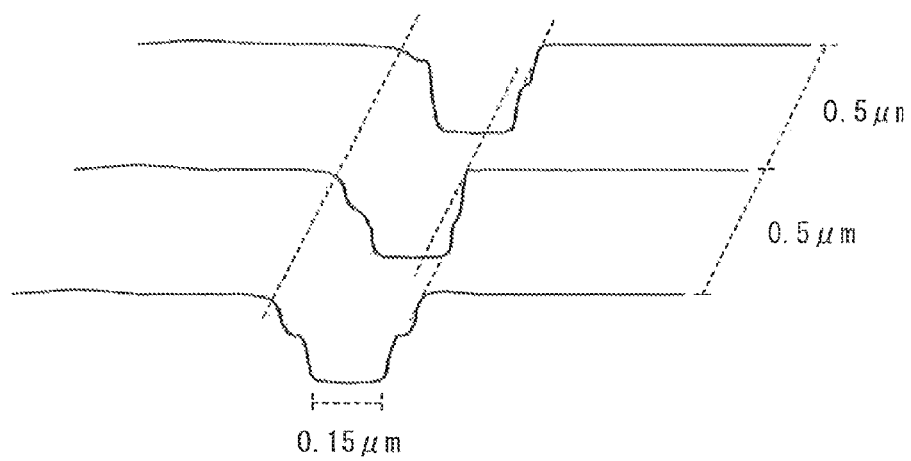
FIG. 6(a) shows the result of measuring a pattern formed in an insulating film in Comparative Example 1, with a SEM for length measurement.
FIG. 6(b) shows the result of measuring a pattern formed in an insulating film in Embodiment 1, with a SEM for length measurement.
Figure 6:
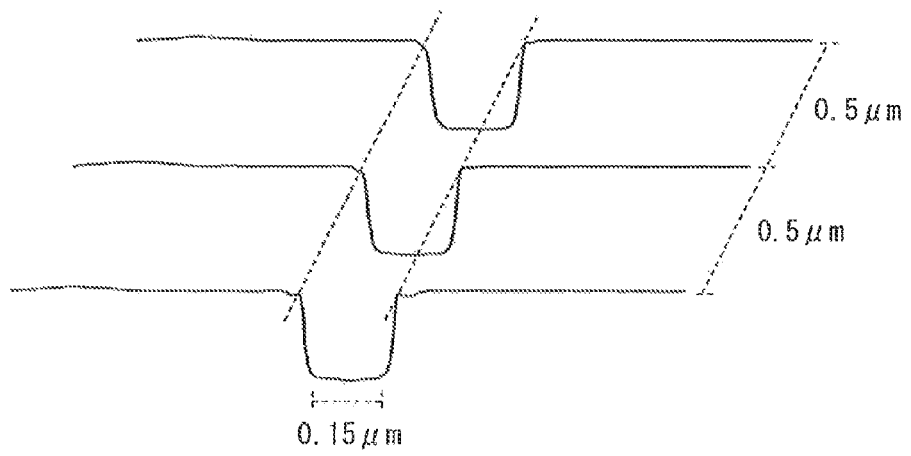

FIG. 6(a) is the measurement result with the length-measurement SEM of the opening pattern formed in the insulating film 22 in Comparative Example 1 and FIG. 6(b) the measurement result with the length-measurement SEM of the opening pattern formed in the insulating film 22 in Embodiment 1. FIGS. 6(a) and 6(b) show profiles obtained by the length-measurement SEM after removal of the EB resist film 46. In Comparative Example 1 without execution of the oxidation treatment, as shown in FIG. 6(a), abnormal erosion occurs in the opening pattern formed in the insulating film 22, so as to result in a shape with a widened pattern. On the other hand, in Embodiment 1 with execution of the oxidation treatment, as shown in FIG. 6(b), the abnormal erosion is suppressed, so as to form the pattern in a good shape in the insulating film 22.

Figure 7:
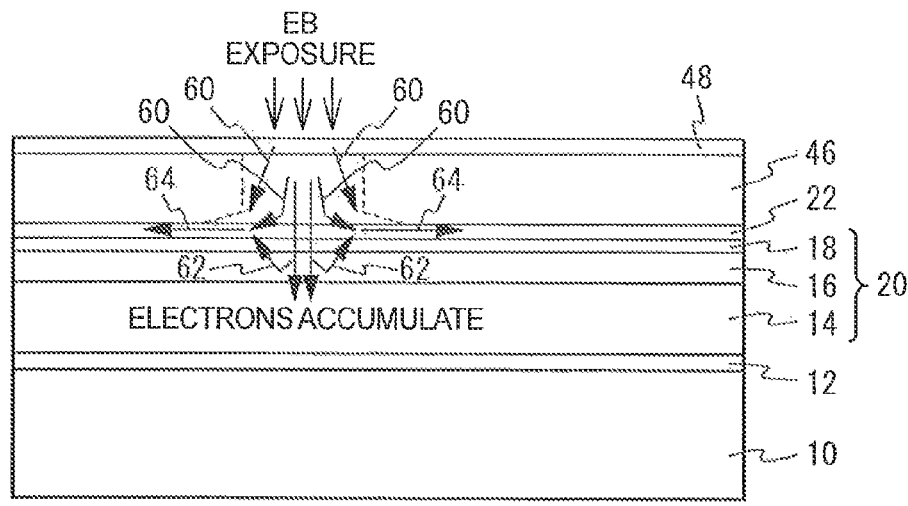
FIG. 7(a) is a cross-sectional view showing an electron accumulated state in the electron beam exposure in Comparative Example 1.
FIG. 7(b) is a cross-sectional view showing an electron accumulated state in the electron beam exposure in Embodiment 1.
Figure 7:
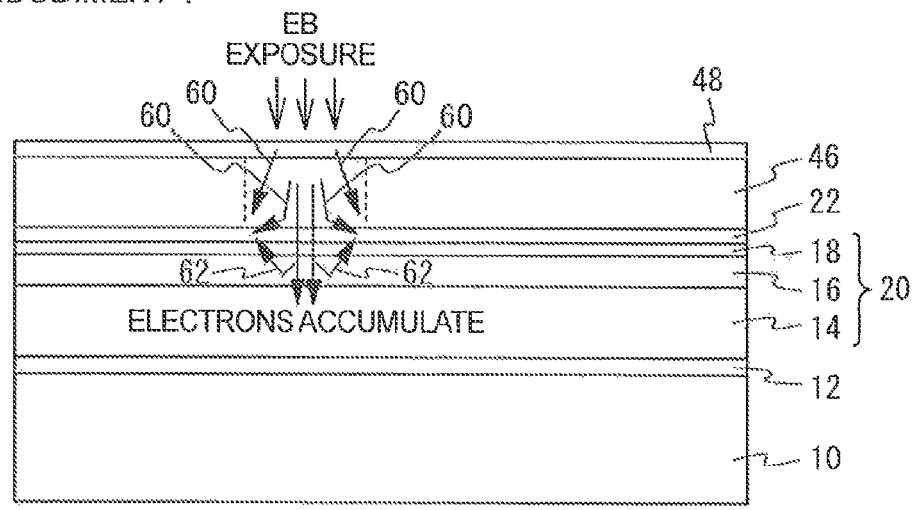

The following will describe the reason for the results that the pattern shape formed in the insulating film 22 is good in Embodiment 1 with execution of the oxidation treatment for the surface of the insulating film 22 and the pattern shape is abnormal in Comparative Example 1 without execution of the oxidation treatment of the surface of the insulating film 22. FIG. 7(a) is a cross-sectional view showing an exposed state in the electron beam exposure in Comparative Example 1 and FIG. 7(b) a cross-sectional view showing an exposed state in the electron beam exposure in Embodiment 1. The figures are drawn without hatching, for clarity of illustration.

As shown in FIG. 7(a), when electrons are injected into the EB resist film 46 by the electron beam exposure, they turn into forward-scattered electrons 60 that spread as scattered by molecules in the EB resist film 46 and backward-scattered electrons 62 largely scattered and bouncing back by the nitride semiconductor layer 20. Scattering angles of the back-scattered electrons 62 are small because of crystallinity of the nitride semiconductors forming the layer 20 and, as a result, electrons accumulate in a narrow region of the insulating film 22. Since the nitride semiconductors have large bandgap energies (e.g., 3.39 eV in the case of GaN), electrons entering the nitride semiconductor layer 20 are less likely to recombine with holes and thus accumulate in the nitride semiconductor layer 20. Repulsive force by the electrons accumulated in the nitride semiconductor layer 20 makes new electrons hard to enter the nitride semiconductor layer 20 and, as a result, electrons further accumulate in the insulating film 22. When the surface of the insulating film 22 is not subjected to the oxidation treatment, there are many defects due to Si—H bonds and dangling bonds of Si atoms in the insulating film 22, as explained with FIG. 5. For this reason, the electrons accumulated in the insulating film 22 migrate near the interface between the insulating film 22 and the EB resist film 46 because of hopping conduction via these defects (electron migration 64 in FIG. 7(a)). It is considered that this electron migration 64 causes exposure of the EB resist film 46 to degrade the shape of the opening pattern 50 formed in the EB resist film 46 and, as a result, the shape of the pattern formed in the insulating film 22 is also degraded.

On the other hand, when the surface of the insulating film 22 is subjected to the oxidation treatment, the defects can be reduced because of the replacement of H of Si—H bonds in the insulating film 22 with O and the binding of O to dangling bonds of Si atoms, as explained with FIG. 5. Therefore, as shown in FIG. 7(b), electrons also accumulate in the insulating film 22 as in the above case, but the reduction of defects in the surface of the insulating film 22 makes the electron migration 64 hard to occur near the interface between the insulating film 22 and the EB resist film 46. It is considered that it can suppress unwanted exposure of the EB resist film 46 and, as a result, the opening pattern 50 is formed in a good shape in the EB resist film 46, whereby the pattern formed in the insulating film 22 is also formed in a good shape.

In Embodiment 1, as described above, the oxidation treatment is carried out for the surface of the insulating film 22 of silicon nitride formed on the nitride semiconductor layer 20, the EB resist film 46 is then formed on the insulating film 22, and the electron beam exposure is carried out for the EB resist film 46. This can suppress the unwanted exposure of the EB resist film 46, as explained with FIG. 7(b), and, as a result, the opening pattern 50 can be formed in the good shape in the EB resist film 46. In Embodiment 1 the oxidation treatment for the surface of the insulating film 22 is carried out prior to the formation of the source electrode 24 and the drain electrode 26, as shown in FIG. 1(b), but the oxidation treatment may be carried out at another timing as far as it is performed prior to the formation of the EB resist film 46. For example, the oxidation treatment for the surface of the insulating film 22 may be carried out after the formation of the source electrode 24 and the drain electrode 26 in FIG. 2(a).

Since the opening pattern 50 is formed in the good shape in the EB resist film 46, the etching process for the insulating film 22 through the opening 50 as shown in FIG. 2(c) can form the pattern in the good shape in the insulating film 22. For example, the pattern can be formed with high dimension controllability.

Figure 8:
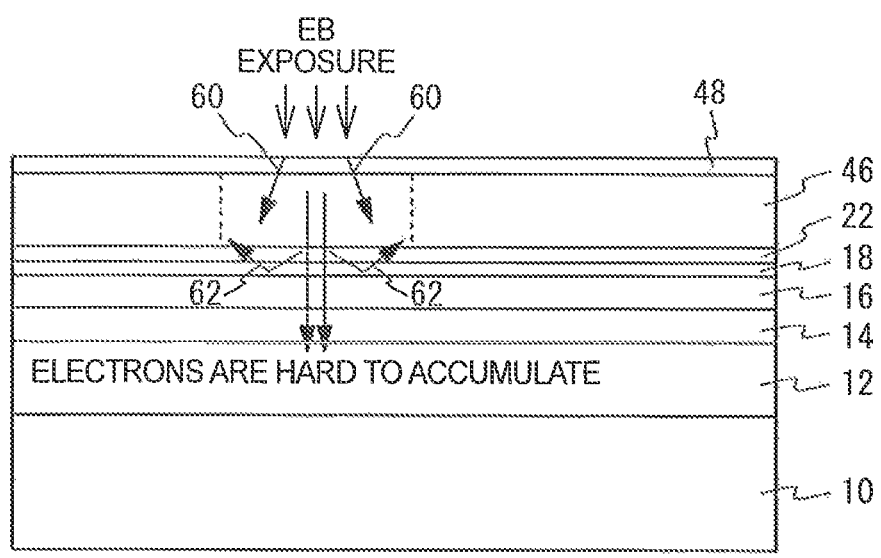
FIG. 8 is a cross-sectional view showing an electron accumulated state in electron beam exposure in the case of a HEMT using GaAs-based semiconductors.

In the HEMT using the nitride semiconductors, as described above, the shape of the opening pattern 50 formed in the EB resist film 46 will degrade unless the oxidation treatment is carried out for the surface of the insulating film 22. However, such degradation does not occur in a HEMT using gallium arsenide (GaAs)-based semiconductors. The reason for it will be described using FIG. 8. FIG. 8 is a cross-sectional view showing an exposed state in the electron beam exposure in the case of the HEMT using the GaAs-based semiconductors. FIG. 8 is drawn without hatching, for clarity of illustration. As shown in FIG. 8, the buffer layer 12 of GaAs, the electron transit layer 14 of GaAs, the electron supply layer 16 of aluminum gallium arsenide (AlGaAs), and the cap layer 18 of GaAs are formed on the substrate 10 of GaAs. The insulating film 22 of SiN is formed on the cap layer 18. The EB resist film 46 and the antistatic film 48 are formed in order on the insulating film 22 and this EB resist film 46 is subjected to the electron beam exposure.

The GaAs-based semiconductors are characterized by large scattering angles of back-scattered electrons 62 because of their crystallinity. For this reason, electrons are unlikely to accumulate in the narrow region of the insulating film 22. Furthermore, the bandgap energies of the GaAs-based semiconductors are smaller than those of the nitride semiconductors (e.g., GaAs: 1.43 eV) and thus electrons going into the GaAs-based semiconductor layers are easy to recombine with holes. Therefore, it becomes possible for new electrons to subsequently go into the GaAs-based semiconductor layers and this also makes electrons hard to accumulate in the insulating film 22. In the HEMT using the GaAs-based semiconductors, as described above, electrons are unlikely to accumulate in the insulating film 22 and, therefore, it is difficult for electrons to migrate near the interface between the insulating film 22 and the EB resist film 46, even if there are defects in the insulating film 22. Accordingly, the degradation of the shape of the opening pattern 50 formed in the EB resist film 46 is less likely to occur.

As described above, it is considered that the unwanted exposure of the EB resist film 46 due to the electron migration 64 near the interface between the EB resist film 46 and the insulating film 22 takes place in cases using wide-bandgap materials such as the nitride semiconductors. Therefore, Embodiment 1 shows the example of the case where the oxidation treatment is carried out for the surface of the insulating film 22 formed on the nitride semiconductor layer 20, but in cases where an insulating film is formed on a silicon carbide layer, it is also preferable to carry out the oxidation treatment for the surface of the insulating film.

Embodiment 1 shows the example of the case where the oxidation treatment is carried out for the surface of the insulating film 22, but a nitridation treatment is also effective in reduction of defects so as to replace H of Si—H bonds with N and bind N to dangling bonds of Si atoms. The nitridation treatment can be carried out, for example, by exposing the surface of the insulating film 22 to a nitrogen plasma. The nitridation treatment by exposing the surface of the insulating film 22 to the nitrogen plasma can be carried out under the below conditions.

Nitrogen concentration: 100%
Pressure: 0.03 Torr to 5 Torr
RF power: 50 W to 800 W
Temperature: 25° C. to 350° C.
Treatment time: 1 minute to 10 minutes The pressure is preferably in the range of 0.5 Torr to 3 Torr and more preferably in the range of 1 Torr to 2 Torr. The RF power is preferably in the range of 200 W to 600 W and more preferably in the range of 300 W to 500 W. The temperature is preferably in the range of 25° C. to 200° C. and more preferably in the range of 25° C. to 100° C. The treatment time is preferably in the range of 2 minutes to 8 minutes and more preferably in the range of 3 minutes to 5 minutes.

The insulating film 22 preferably contains Si-rich silicon nitride, in terms of suppressing the current collapse. However, Si-rich silicon nitride has many dangling bonds of Si atoms or the like and thus the electron migration 64 is likely to occur. When the oxidation treatment is carried out for the surface of the insulating film 22 in such cases, the surface part of the insulating film 22 can be changed into the defect-reduced region 22a (surface side) and the other part can be kept as Si-rich region 22b (back side). This can suppress the electron migration 64 near the interface between the insulating film 22 and the EB resist film 46 and suppress the current collapse. The thickness of the defect-reduced region 22a is preferably in the range of not less than 2 nm, more preferably in the range of not less than 3 nm, and still more preferably in the range of not less than 4 nm. It is also considered that electron migration occurs in the Si-rich region 22b; however, even if electrons migrate in the region 22b, no problem will arise because the EB resist film 46 is hard to be exposed thereby. Additionally, the concentration of oxygen or nitrogen in region 22a rises through oxidation treatment or nitridation treatment, in comparison to region 22b. Incidentally, although a natural oxide film is formed on a surface of the insulating film 22 after the deposit of the insulating film 22, the thickness of the natural oxide film is not more than 0.3 μm and thus very thin even in comparison to the above oxide-treated region 22a.

The etching process is carried out for the insulating film 22 through the opening 50 formed in the EB resist film 46 by electron beam exposure and the gate electrode 28 is formed in the opening pattern formed by the etching process, as shown in FIG. 2(c) to FIG. 3(b). As described above, Embodiment 1 shows the example of the case where the electron beam exposure is used for the formation of the gate electrode 28, but the electron beam exposure may also be used for formation of ohmic electrodes such as the source electrode 24 and the drain electrode 26. Namely, it may be applied to a case where the etching process is carried out for the insulating film through opening patterns formed in the EB resist film by electron beam exposure and the ohmic electrodes are formed in the opening patterns formed by the etching process.

Embodiment 1 shows the example of the case of the HEMT having the nitride semiconductor layer 20 including the electron transit layer 14 and the electron supply layer 16 with the larger bandgap than the electron transit layer 14, but the present invention is not limited to this example. The present invention is applicable to the method of manufacturing the semiconductor device, the method including performing the electron beam exposure for the EB resist film formed on the insulating film, in the structure in which the insulating film is formed on the nitride semiconductor layer or on the silicon carbide layer. The nitride semiconductors refer to III-V nitride semiconductors and examples thereof include InN, InAlN, InGaN, InAlGaN, and so on, in addition to GaN and AlGaN. The insulating film may also be one comprising silicon oxide ($SiO_2$) or silicon oxynitride (SiON), as well as silicon nitride (SiN). It is because the electron migration 64, as explained with FIG. 7(*a*), is also likely to occur in these cases. The insulating film may be or may not be in a stoichiometric composition.

The above detailed the examples of the present invention but it should be noted that the present invention is not limited to such specific examples and can be modified or changed in many ways without departing from the scope of the present invention described in the scope of claims.

What is claimed is:

1. A semiconductor device comprising:
   a semiconductor layer;
   an insulating film of silicon nitride on the semiconductor layer, the insulating film having a concentration of oxygen in an upper region thereof that is greater than that in a lower region thereof, and having an Si content that is uniform in a thickness direction thereof;
   source and drain electrodes formed in openings of the insulating film and in contact with the semiconductor layer, and
   a gate electrode formed in an opening in the insulating film that is located between the source electrode and the drain electrode and formed in contact with the semiconductor layer.

2. The semiconductor device according to claim 1, wherein the thickness of the upper region of the insulating film is equal to or larger than 2 nm.

3. The semiconductor device according to claim 1, wherein the width of the opening in the insulating film for the gate electrode is 0.2 µm or less.

4. The semiconductor device according to claim 1, wherein the thickness of the insulating film is equal to or smaller than 20 nm.

5. The semiconductor device according to claim 1, wherein the semiconductor layer is composed of gallium nitride, aluminum gallium nitride, indium aluminum nitride, indium aluminum gallium nitride, or aluminum nitride.

6. A semiconductor device comprising:
   a semiconductor layer;
   an insulating film of silicon nitride on the semiconductor layer, the insulating film having an Si content that is uniform in a thickness direction thereof, and having an upper region and a lower region, the upper region being formed by exposing the surface of the insulating film to ozone or an oxygen plasma;
   source and drain electrodes formed in openings in the insulating film and in contact with the semiconductor layer, and
   a gate electrode formed in an opening in the insulating film that is located between the source electrode and the drain electrode and formed in contact with the semiconductor layer.

7. The semiconductor device according to claim 6, wherein the thickness of the upper region of the insulating film is equal to or larger than 2 nm.

8. The semiconductor device according to claim 6, wherein a concentration of oxygen in the upper region is greater than that of the lower region and a thickness of the upper region is equal to or greater than 2 nm.

9. The semiconductor device according to claim 6, Wherein the width of the opening in the insulating film for the gate electrode is 0.2 µm or less.

10. The semiconductor device according to claim 6, wherein the thickness of the insulating film is equal to or smaller than 20 nm.

11. The semiconductor device according to claim 6, wherein the semiconductor layer is composed of gallium nitride, aluminum gallium nitride, indium aluminum nitride, indium aluminum gallium nitride, or aluminum nitride.

* * * * *